United States Patent
Lu et al.

(10) Patent No.: US 9,373,586 B2
(45) Date of Patent: Jun. 21, 2016

(54) COPPER ETCHING INTEGRATION SCHEME

(71) Applicant: Taiwan Semiconductor Manufacturing Co., Ltd., Hsin-Chu (TW)

(72) Inventors: Chih-Wei Lu, Hsinchu (TW); Chung-Ju Lee, Hsinchu (TW); Hsiang-Huan Lee, Jhudong Township (TW); Tien-I Bao, Dayuan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 79 days.

(21) Appl. No.: 14/218,060

(22) Filed: Mar. 18, 2014

(65) Prior Publication Data

US 2014/0197538 A1    Jul. 17, 2014

Related U.S. Application Data

(63) Continuation-in-part of application No. 13/676,260, filed on Nov. 14, 2012, now Pat. No. 8,728,936.

(51) Int. Cl.

| | |
|---|---|
| *H01L 23/48* | (2006.01) |
| *H01L 23/538* | (2006.01) |
| *H01L 23/528* | (2006.01) |
| *H01L 23/532* | (2006.01) |
| *H01L 21/768* | (2006.01) |
| *H01L 23/522* | (2006.01) |

(52) U.S. Cl.
CPC ........ *H01L 23/5384* (2013.01); *H01L 21/7682* (2013.01); *H01L 21/76885* (2013.01); *H01L 23/5283* (2013.01); *H01L 23/5329* (2013.01); *H01L 23/53233* (2013.01); *H01L 23/53295* (2013.01); *H01L 21/76852* (2013.01); *H01L 23/5222* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,875,693 B1* | 4/2005 | May et al. | 438/687 |
| 7,554,176 B2* | 6/2009 | Naito | H01L 21/76801 257/620 |
| 7,612,453 B2 | 11/2009 | Usami | |
| 2004/0121583 A1* | 6/2004 | Bao et al. | 438/627 |
| 2004/0161923 A1* | 8/2004 | Bae | H01L 21/76804 438/633 |
| 2004/0227243 A1* | 11/2004 | Perng | 257/751 |
| 2004/0238964 A1* | 12/2004 | Kawano et al. | 257/758 |
| 2005/0142857 A1* | 6/2005 | Lee | 438/638 |
| 2006/0027924 A1* | 2/2006 | Chen et al. | 257/751 |

(Continued)

OTHER PUBLICATIONS

Non-Final Office Action dated Jul. 18, 2013 for U.S. Appl. No. 13/676,260. 19 Pages.

(Continued)

*Primary Examiner* — Reema Patel
(74) *Attorney, Agent, or Firm* — Eschweiler & Associates, LLC (57) ABSTRACT

The present disclosure is directed to an interconnect structure. The metal interconnect structure has a metal body disposed over a semiconductor substrate and a projection extending from the metal body. A barrier layer continuously extends over the projection from a first sidewall of metal body to an opposing second sidewall of the metal body. A layer of dielectric material is disposed over the semiconductor substrate at a position abutting the metal body and the projection.

17 Claims, 5 Drawing Sheets

(56) References Cited

U.S. PATENT DOCUMENTS

2008/0124917 A1* 5/2008 Oh et al. .................. 438/637
2009/0305502 A1* 12/2009 Lee .................. H01L 21/76898
　　　　　　　　　　　　　　　　　　　　　　438/667

OTHER PUBLICATIONS

Notice of Allowance dated Nov. 27, 2013 for U.S. Appl. No. 13/676,260. 18 Pages.

* cited by examiner

COPPER ETCHING INTEGRATION SCHEME

REFERENCE TO RELATED APPLICATION

This application is a continuation-in-part of U.S. application Ser. No. 13/676,260 filed on Nov. 14, 2012.

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor devices are manufactured or fabricated on semiconductor wafers using a number of different processing steps to create transistor and interconnection elements. To electrically connect transistor terminals associated with the semiconductor wafer, conductive (e.g., metal) wires, conductive vias, and the like are formed in dielectric materials as part of the semiconductor device. The conductive wires and vias couple electrical signals and power between transistors, internal circuit of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and etching steps can be performed to form a pattern of recessed areas in a dielectric layer, such as a low-k dielectric layer, on a semiconductor wafer that serve as trenches and via holes for the interconnections. A deposition process may then be performed to deposit a metal layer over the semiconductor wafer thereby depositing metal both in the trenches and via holes and also on the non-recessed areas of the semiconductor wafer.

Increasingly, low-k dielectric layers are used to reduce signal delay and power loss effects as integrated circuit devices are scaled down. One way this has been accomplished has been to introduce porosity or dopants into the dielectric insulating layer.

As a result, the need for lower dielectric constant materials has resulted in the development of several different types of organic and inorganic low-k materials. In particular, incorporation of low-k materials with dielectric constants less than about 3.0 has become standard practice as semiconductor feature sizes have diminished to less than 0.13 microns. As feature sizes decrease below 0.13 microns, for example to 65 nm and below, materials with dielectric constants less than about 2.5 are often used. Several different organic and inorganic low-k materials have been developed and proposed for use in semiconductor devices as insulating material having dielectric constants between about 2.2 and about 3.0.

Low-k dielectric materials, however, are susceptible to damage from the etching processes because they are softer, less chemically stable or more porous, or any combination of these factors. The plasma damage can manifest itself in higher leakage currents, lower breakdown voltages, and changes in the dielectric constant associated with the low-k dielectric material.

There is, therefore, a need in the integrated circuit manufacturing art to develop a manufacturing process whereby interconnect structures may be formed without encountering the various problems presented by porous low-K dielectric layers to improve integrated circuit device yield, performance, and reliability.

Accordingly, the present disclosure is directed to methods of fabrication of an interconnect structure. The methods provide a process for defining an interconnect structure that eliminates low-k dielectric damage caused during etching processes. The process provides the further advantage of removing etch stop or NFARC (nitrogen-free anti-reflective coating) layers, making the process more cost effective.

Figure 1A:
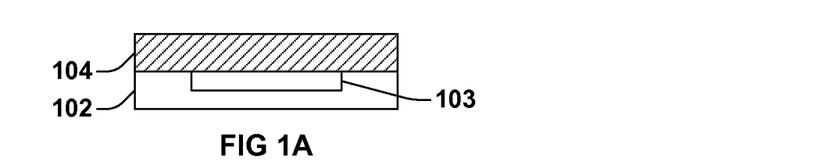
FIGS. 1A-1M are partial cross sectional views illustrating steps of one embodiment of forming an interconnect structure in accordance with the disclosure.

FIGS. 1A-1M illustrate a plurality of partial cross section diagrams illustrating one embodiment of a method of forming an interconnect structure at stages in the manufacturing process according to the disclosure. Referring to FIG. 1A, a semiconductor substrate 102 having a conductive region 103 is provided. Substrate 102 is understood to include a semiconductor wafer or substrate, comprised of a semiconducting material such as silicon or germanium, or a silicon on insulator structure (SOI). Semiconductor structure can further include one or more conductive layers (such as metal or silicon) and/or insulating layers, and one or more active or passive devices formed in or over the substrate, or the like, for example, a display substrate such as a liquid crystal display (LCD), plasma display, electro-luminescence (EL) lamp display, or a light emitting diode (LED) substrate.

Overlying substrate 102 and covering conductive region 103 is a sacrificial layer 104. Sacrificial layer 104 comprises a homopolymer or copolymer. In one embodiment, sacrificial layer 104 comprises one or more of polyimide or P(neopentyl methacrylate-co-theylene glycol dimethacrylate copolymer (P(npMAco-EGDA). Sacrificial layer 104 is deposited by one or more of chemical vapor deposition (CVD) or spin-on coating processes. The thickness of the sacrificial layer will be in a range of from about 1000 Å (angstroms) to about 100 Å.

Figure 1B:
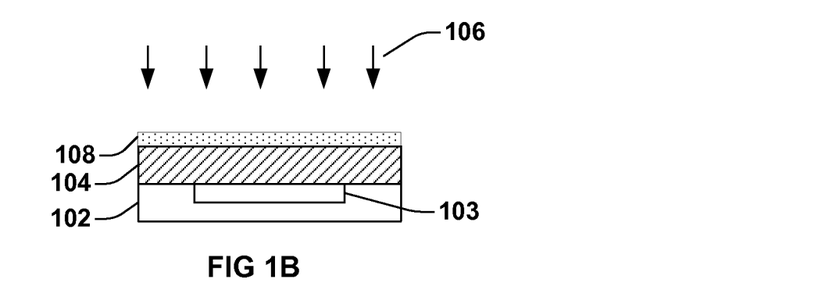

A dielectric hard mask layer 108 is then deposited 106 by, for example, a CVD process, as illustrated in FIG. 1B. The dielectric hard mask layer 108 is used to pattern the sacrificial layer 104 in a subsequent photolithographic process. In some embodiments, the dielectric hard mask layer 108 comprises a material such as silicon-oxide, silicon-nitride, silicon-oxynitride, and silicon-carbide. The dielectric hard mask layer 108 will have a thickness of from about 1000 Å to about 10 Å.

Figure 1C:
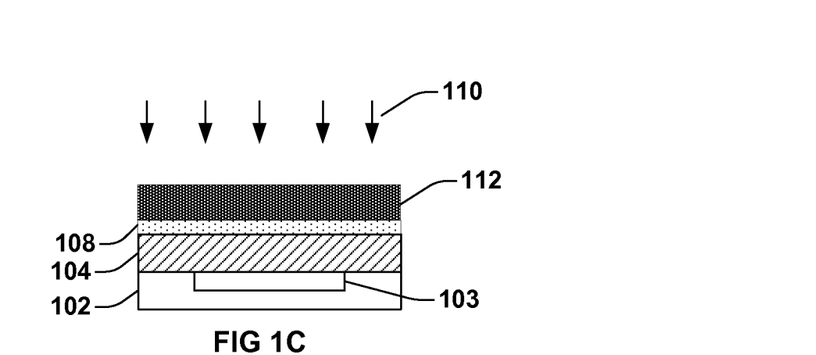
Figure 1D:
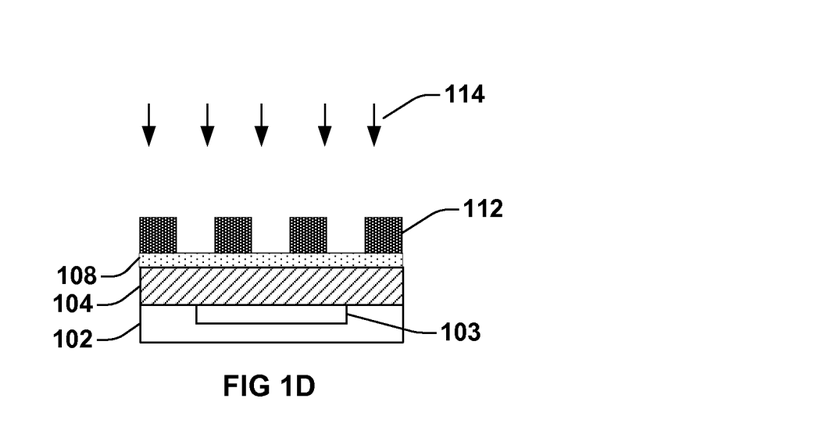
Figure 1E:
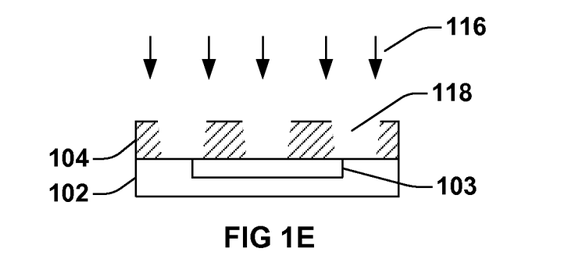

Following deposition of the hard mask layer 108, in one embodiment, a photoresist film 112 is formed by process 110 over the hard mask layer 108, as illustrated in FIG. 1C. Conventional photoresist materials may be used. The photoresist film 112 can be a carbon-containing, organic material. Various photoresists having various thicknesses can be utilized. Photo resist patterning and etching 114 are performed in FIG. 1D Hard mask 108 patterning and first etching process 116 through the hard mask layer 108 and into the sacrificial layer 104 are then performed to remove a portion of sacrificial layer 104 and form a first feature defined by an opening 118 in the sacrificial layer 104, as shown in FIG. 1E. In one embodiment, first feature comprises a trench.

Figure 1F:
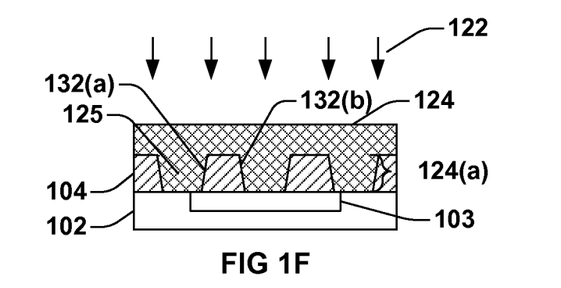

In FIG. 1F, a metal layer 124 is deposited 122 over first feature and filling opening 118 in sacrificial layer 104 to form a metal body 125 therein. Metal body 125 is defined by a lower portion 124(a) of the metal layer 124. Metal body 125 includes angled opposing sidewalls. In some embodiments, the metal body 125 comprises a metal wire layer configured to provide for a lateral interconnection (i.e., an interconnection parallel to the surface of the semiconductor substrate 102). In one embodiment, the metal layer 124 can be formed from elements such as aluminum (Al), tungsten (W), copper (Cu), copper manganese (CuMn), copper-titanium (CuTi), copper vanadium (CuV), copper chromium (CuCr), or copper-niobium (CuNb), and the like. Metal layer 124 can be formed using, for example, a plasma vapor deposition technique, among others. Metal layer 124 can be deposited at a thickness, in one embodiment, of from about 100 Å (Angstroms) to about 20,000 Å.

Figure 1G:
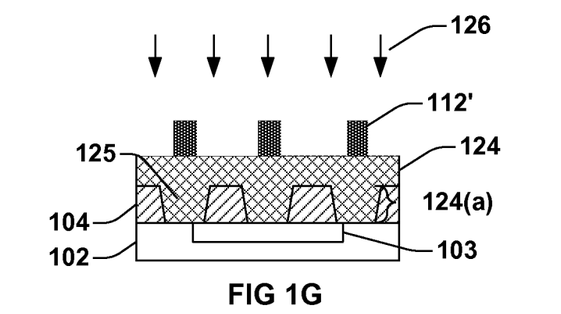
Figure 1H:
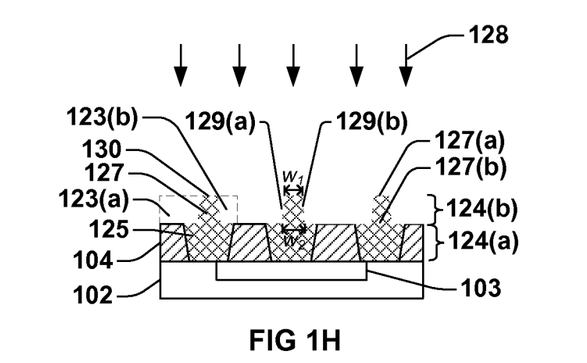

A photoresist film 112' is formed over the metal layer 124 and patterned 126 by conventional techniques, as shown in FIG. 1G. A second etch 128 is performed to pattern and etch an upper portion 124(b) of the metal layer 124 to form a second feature having first recesses 123(a), 123(b) and defined by a vertical projection 127 extending from the metal body 125, as illustrated in FIG. 1H.

The vertical projection 127 includes angled opposing sidewalls, 129(a) and 129(b), and upper surface 130. In some embodiments, the angled opposing sidewalls, 129(a) and 129(b), are tapered such that the vertical projection 127 has a narrower top surface 127(a) and wider bottom surface 127(b) (i.e., $w_1 < w_2$). In some embodiments, the vertical projection 127 comprises a metal via configured to provide for a vertical interconnection between an underlying metal body and an overlying metal body.

Figure 1I:
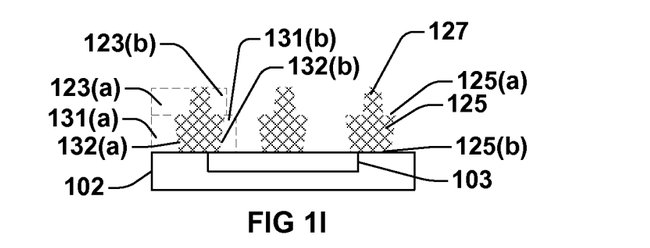

In FIG. 1I, sacrificial layer 104 is removed by one or more of, for example, etching, wet stripping, annealing, UV or IR radiation techniques (not shown). Removal of the sacrificial layer 104 exposes angled opposing sidewalls 132(a), 132(b) of metal body 125 and forms second recesses 131(a), 131(b). Angled opposing sidewalls 132(a), 132(b) taper such that metal body 125 has a wider top surface 125(a) and narrower bottom surface 125(b).

In one embodiment, a barrier layer 134 is formed overlying and encompassing metal body 125 and vertical projection 127 and disposed between dielectric material 136 (FIG. 1K) and metal layer 124. By encompassing metal body 125 and vertical projection 127, barrier layer 134 is continuous. Barrier layer 134 is formed by depositing a dielectric material, for example, silicon-nitride and silicon-carbide. In one embodiment, barrier layer 134 is formed by depositing a metal, for example, TiN, TaN, Co, WN, TiSiN, TaSiN, or combinations thereof. In another embodiment, an annealing 135 is performed at a temperature of about greater than 200° C., such that barrier layer 134 is self-forming, as illustrated FIG. 1J.

Figure 1J:
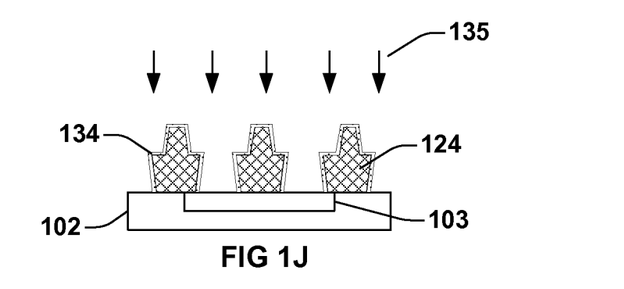

The thickness of the barrier layer 134 can be, in one embodiment, from about 1 Å (Angstrom) to about 300 Å.

Figure 1K:
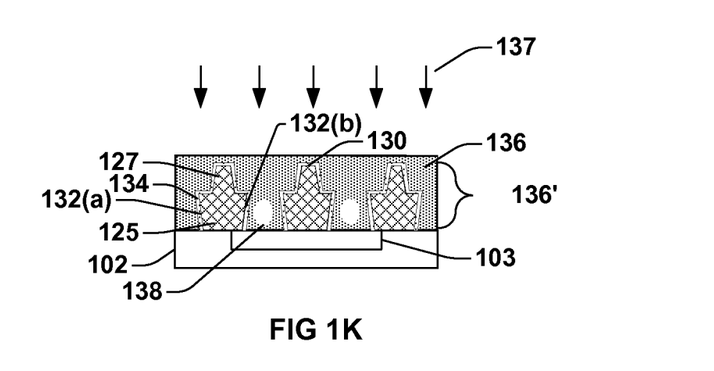

In FIG. 1K, low-k dielectric material 136 is deposited by process 137 to fill first 123(a), 123(b) and second 131(a), 131(b) recesses and overlying the upper surface 130 of the vertical projection 127 to form a dielectric region 136'. Low-k dielectric material 136 thus encapsulates vertical projection 127 and metal body 125. The low-k dielectric includes dielectrics with k less than about 3. Such dielectrics include, for example, carbon-doped silicon dioxide, also referred to as organosilicate glass (OSG) and carbon-oxide. Low-k materials may also include borophosphosilicate glass (BPSG), borosilicate glass (BSG), and phosphosilicate glass (PSG), among others. The dielectric layer 136 may be formed using, for example, tetraethyl orthosilicate (TEOS), chemical vapor deposition (CVD), plasma enhanced CVD (PECVD), low pressure CVD (LPCVD), or spin-on coating techniques. The thickness of the low-k dielectric will be, in one embodiment, from about 100 Å to about 20000 Å.

Figure 1L:
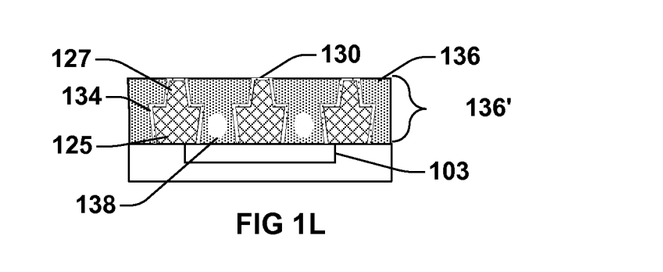

In the embodiment illustrated in FIG. 1K, at least one air gap 138 is formed within the dielectric material 136. The air gap 138 is disposed in the dielectric region 136' between angled sidewalls 132(a), 132(b) of adjacent metal bodies 125. Air gap 138 can be self-forming during deposition of the low-k material 136. In one embodiment, the size of the air gap can be from about 0 Å to about 20000 Å. It is contemplated, however, that the size of the air gap can be controlled by the low-k material 136 deposition process. A chemical mechanical polishing (CMP) process can then be performed to remove excess dielectric layer 136 and expose upper surface 130 of vertical projection 127, as illustrated in FIG. 1L.

Figure 1M:
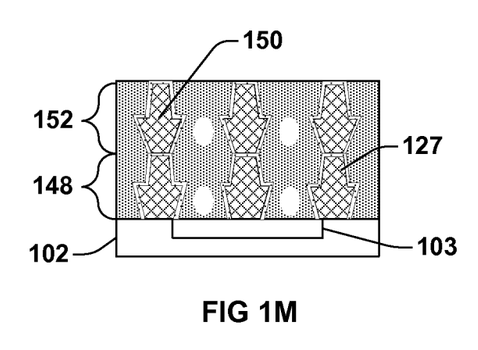

Following CMP process, the method can be repeated to form an additional metal layer 150 of an interconnect structure 152 overlying vertical projection 127 and electrically coupled to the vertical projection 127, as illustrated in FIG. 1M, so as to form an integrated circuit of at least two adjacent interconnect structures, 148 and 152.

Figure 2:
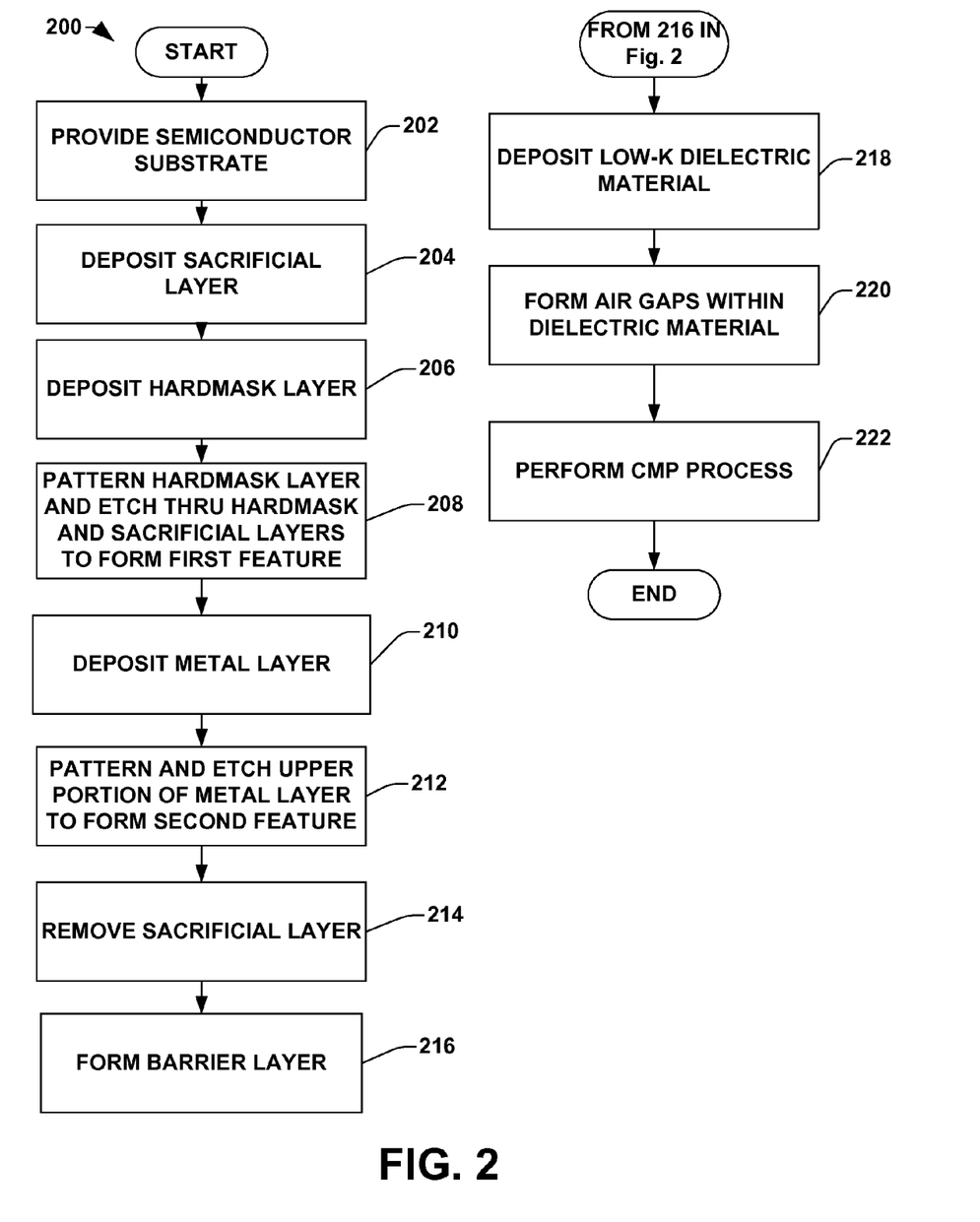
FIG. 2 illustrates a flow diagram of some embodiments of a method for the fabrication of an interconnect structure in accordance with the disclosure.

FIG. 2 illustrates a flow diagram of some embodiments of a method 200 for formation of a semiconductor structure according to an embodiment of the present disclosure. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 202 a semiconductor substrate is provided. A sacrificial layer is then formed over the substrate at step 204.

At step 206, a hard mask layer is deposited overlying the sacrificial layer.

At step 208, a first feature is formed by patterning and etching through hard mask and sacrificial layer to form an opening in the sacrificial layer.

At step 210, a metal layer is deposited overlying first feature and filling the feature opening.

At step 212, an upper portion of the metal layer is patterned and etched to form a second feature.

At step 214, sacrificial layer is removed.

At step 216, a barrier layer is formed by CVD, PVD, MOCVD or ALD, or barrier layer can be self-formed by annealing.

At step 218, a low-k dielectric material is deposited to fill recesses and encompass metal body and vertical projection.

At step 220, at least one air gap is formed in the low-k dielectric material. The air gap is disposed in the dielectric region between adjacent interconnect structures.

At step 222, a CMP process is performed to remove excess dielectric layer and expose a top surface of the vertical projection. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to method for forming an interconnect structure, and a related apparatus.

In some embodiments, the present disclosure relates to an interconnect structure. The interconnect structure comprises an interconnect structure. The interconnect structure includes a metal body disposed over a semiconductor substrate, and a projection extending outward from a top surface of the metal body. The interconnect structure further comprises a barrier layer continuously extending over the projection from a first sidewall of the metal body to an opposing second sidewall of the metal body. The interconnect structure further comprises a layer of dielectric material disposed over the semiconductor substrate at a position abutting the metal body and the projection.

In other embodiments, the present disclosure relates to a metal interconnect structure. The metal interconnect structure comprises a metal wire overlying a semiconductor substrate, and a metal via disposed onto and in direct contact with a top surface of the metal wire, wherein the metal via includes angled opposing sidewalls which taper to give the metal via a bottom surface that is wider than a top surface. The metal interconnect structure further comprises a layer of dielectric material overlying the metal wire and the metal via.

In yet other embodiments, the present disclosure relates to an integrated circuit. The integrated circuit comprises a metal body disposed over a semiconductor substrate and a projection disposed onto and in direct contact with a top surface of the metal body. The integrated circuit further comprises a dielectric material surrounding the metal body and the projection. The integrated circuit further comprises a barrier layer disposed between the dielectric material and the metal body and the projection, wherein the barrier layer does not abut a bottom surface of the metal body.

What is claimed is:

1. An interconnect structure, comprising:
    a metal body disposed over a semiconductor substrate;
    a projection extending outward from a top surface of the metal body and having a width that is less than a width of the metal body;
    a barrier layer continuously extending over the projection from a first sidewall of the metal body to an opposing, second sidewall of the metal body;
    a layer of dielectric material disposed over the semiconductor substrate at a position surrounding the metal body and the projection;
    an additional metal body overlying the projection and electrically coupled to the projection, wherein the additional metal body has a greater width than the projection and wherein the barrier layer extends vertically between the projection and the additional metal body; and
    an additional projection overlying the additional metal body and having a smaller width than the additional metal body.

2. The interconnect structure of claim 1, wherein the barrier layer continuously extends along sidewalls of the metal body and the projection, but is not located between the metal body and the projection.

3. The interconnect structure of claim 1, wherein the metal body comprises a metal wire that laterally extends past a side of the projection.

4. The interconnect structure of claim 1, wherein the metal body includes angled opposing sidewalls which taper to give the metal body a top surface that is wider than a bottom surface.

5. The interconnect structure of claim 1, wherein the projection includes angled opposing sidewalls which taper to give the projection a bottom surface that is wider than a top surface.

6. The interconnect structure of claim 1, wherein the metal body and the projection comprise aluminum (Al), tungsten (W), copper (Cu), copper manganese (CuMn), copper-titanium (CuTi), copper vanadium (CuV), copper chromium (CuCr), or copper-niobium (CuNb).

7. The interconnect structure of claim 1, further comprising:
    an additional layer of dielectric material disposed over the semiconductor substrate at a position laterally abutting the additional metal body and the additional projection, wherein the additional layer of dielectric material abuts the layer of dielectric material.

8. A metal interconnect structure, comprising:
    a metal wire overlying a semiconductor substrate;
    a metal via disposed onto and in direct contact with a top surface of the metal wire, wherein the metal via includes angled opposing sidewalls which taper to give the metal via a bottom surface that is wider than a top surface and that is narrower than the top surface of the metal wire;
    a layer of dielectric material surrounding the metal wire and the metal via; and
    a barrier layer continuously extending along sidewalls of the metal wire and on upper surfaces of the metal via and the metal wire.

9. The metal interconnect structure of claim 8, further comprising at least one air gap disposed within the layer of dielectric material.

10. The metal interconnect structure of claim 8, wherein the barrier layer is not on bottom surface of the metal wire, so that the metal wire abuts a metal layer underlying the metal wire.

11. The interconnect structure of claim 8, further comprising:
    an additional metal wire overlying the metal via and having a greater width than the metal via;
    an additional metal via disposed onto and in direct contact with a top surface of the additional metal wire and having a smaller width than the additional metal wire; and an additional layer of dielectric material disposed over the semiconductor substrate at a position laterally abutting the additional metal wire and the additional metal via, and abutting the layer of dielectric material.

12. An integrated circuit, comprising:
a metal body disposed over a semiconductor substrate and having tapered sidewalls that cause an upper surface of the metal body to have a greater width than a lower surface of the metal body;
a projection disposed onto and in direct contact with a top surface of the metal body and having tapered sidewalls that cause a lower surface of the projection to have a greater width than an upper surface of the projection and a smaller width than an upper surface of the metal body;
a dielectric material surrounding the metal body and the projection; and
a barrier layer disposed between the dielectric material and the metal body and the projection.

13. The integrated circuit of claim 12, wherein the barrier layer comprises a continuous layer that contacts opposing sidewalls of the metal body and the projection and which is disposed onto and in direct contact with the top surface of the metal body and the projection.

14. The integrated circuit of claim 12, wherein the tapered sidewalls of the projection connect the upper surface and the lower surface of the projection.

15. The integrated circuit of claim 12, wherein the dielectric material continuously extends from below a bottom surface of the metal body to a top surface of the projection.

16. The integrated circuit of claim 12, wherein the metal body and the projection comprise aluminum (Al), tungsten (W), copper (Cu), copper manganese (CuMn), copper-titanium (CuTi), copper vanadium (CuV), copper chromium (CuCr), or copper-niobium (CuNb).

17. The integrated circuit of claim 12, further comprising at least one air gap within the dielectric material.

* * * * *